(12) United States Patent
Haden et al.

(10) Patent No.: US 9,413,137 B2
(45) Date of Patent: Aug. 9, 2016

(54) PULSED LINE BEAM DEVICE PROCESSING SYSTEMS USING LASER DIODES

(71) Applicant: nLight Photonics Corporation, Vancouver, WA (US)

(72) Inventors: James M. Haden, Vancouver, WA (US); Scott R. Karlsen, Battle Ground, WA (US); Robert J. Martinsen, West Linn, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 13/840,253

(22) Filed: Mar. 15, 2013

(65) Prior Publication Data

US 2014/0269793 A1 Sep. 18, 2014

(51) Int. Cl.

| | |
|---|---|
| *H01L 21/425* | (2006.01) |
| *H01L 21/20* | (2006.01) |
| *H01L 21/36* | (2006.01) |
| *H01S 5/042* | (2006.01) |
| *H01S 5/40* | (2006.01) |
| *H01L 21/02* | (2006.01) |

(Continued)

(52) U.S. Cl.
CPC ............. *H01S 5/0428* (2013.01); *B23K 1/0056* (2013.01); *B23K 26/0066* (2013.01); *B23K 26/0622* (2015.10); *B23K 26/0853* (2013.01); *H01L 21/02532* (2013.01); *H01L 21/02678* (2013.01); *H01L 21/02686* (2013.01); *H01S 5/4012* (2013.01); *B29C 65/1616* (2013.01); *B29C 65/1664* (2013.01); *B29C 65/1674* (2013.01); *B29C 66/919* (2013.01); *B29C 66/91443* (2013.01); *B29C 66/949* (2013.01)

(58) Field of Classification Search
CPC .......... H01L 31/18; H01L 21/44; H01L 21/70
USPC ........... 438/72, 530, 106, 458, 795, 486, 487, 438/149; 257/436, 623, E31.011, 257/E21.133–E21.134, E21.567, E27.12, 257/E21.599
See application file for complete search history.

(56) References Cited

U.S. PATENT DOCUMENTS

| | | | |
|---|---|---|---|
| 4,498,951 | A | 2/1985 | Tamura et al. |
| 6,451,631 | B1 | 9/2002 | Grigoropoulos et al. |

(Continued)

FOREIGN PATENT DOCUMENTS

| | | |
|---|---|---|
| CN | 1508844 | 6/2004 |
| CN | 1531023 | 9/2004 |

(Continued)

OTHER PUBLICATIONS

Delmdahl, "The Excimer Laser: Precision Engineering," Nature Photonics 4:286 (May 2010).

(Continued)

*Primary Examiner* — Yuanda Zhang
*Assistant Examiner* — Sheikh Maruf
(74) *Attorney, Agent, or Firm* — Klarquist Sparkman, LLP

(57) ABSTRACT

Pulsed laser beams provided by laser diodes or arrays of laser diodes are applied to substrates such as amorphous silicon. The optical beam is based on a plurality of beams from respective laser diodes and is shaped, homogenized, and directed to a substrate. Duty cycles of the laser diodes are selected to be less than about 0.2. Exposures are applied to Aft an amorphous silicon layer on a rigid or flexible substrate to produce a polysilicon layer with a mobility of at least 50 $cm^2/Vs$.

24 Claims, 2 Drawing Sheets

(51) Int. Cl.
*B23K 1/005* (2006.01)
*B23K 26/00* (2014.01)
*B23K 26/08* (2014.01)
*B29C 65/16* (2006.01)
*B29C 65/00* (2006.01)

(56) References Cited

U.S. PATENT DOCUMENTS

| | | | |
|---|---|---|---|
| 8,288,683 | B2 | 10/2012 | Jennings et al. |
| 8,362,391 | B2 | 1/2013 | Partlo et al. |
| 2002/0050488 | A1* | 5/2002 | Nikitin ............... B23K 26/0604 219/121.64 |
| 2002/0136507 | A1* | 9/2002 | Musk ............................ 385/95 |
| 2003/0227038 | A1* | 12/2003 | Kikuchi ............. H01L 21/2026 257/291 |
| 2004/0011772 | A1* | 1/2004 | Okumura ........... B23K 26/0604 219/121.69 |
| 2004/0198028 | A1* | 10/2004 | Tanaka ............... B23K 26/0604 438/487 |
| 2005/0059265 | A1* | 3/2005 | Im ................................. 438/795 |
| 2005/0272185 | A1* | 12/2005 | Seki ........................ C30B 13/24 438/149 |
| 2006/0019474 | A1* | 1/2006 | Inui .................... B23K 26/0604 438/487 |
| 2006/0254500 | A1* | 11/2006 | Im et al. ........................ 117/43 |
| 2007/0178674 | A1* | 8/2007 | Imai et al. ..................... 438/487 |
| 2007/0296966 | A1* | 12/2007 | Benicewicz et al. .......... 356/318 |
| 2008/0087895 | A1* | 4/2008 | Han .................... B23K 26/0613 257/72 |
| 2009/0152247 | A1* | 6/2009 | Jennings et al. ......... 219/121.61 |
| 2009/0173724 | A1* | 7/2009 | Ogino et al. ............. 219/121.75 |
| 2009/0309104 | A1* | 12/2009 | Im ........................... C30B 13/22 257/75 |
| 2010/0320086 | A1* | 12/2010 | Lee et al. .................. 204/403.01 |
| 2011/0188016 | A1* | 8/2011 | De Jager et al. ................ 355/55 |
| 2012/0012594 | A1* | 1/2012 | Boegli et al. .................. 220/674 |
| 2012/0028399 | A1 | 2/2012 | Moslehi et al. |
| 2012/0168411 | A1* | 7/2012 | Farmer et al. ............ 219/121.67 |
| 2012/0197114 | A1* | 8/2012 | Emelianov et al. ........... 600/431 |
| 2012/0260847 | A1 | 10/2012 | Van Der Wilt |
| 2014/0071421 | A1* | 3/2014 | De Jager et al. ................ 355/71 |
| 2014/0187055 | A1* | 7/2014 | Martinsen et al. ............ 438/795 |

FOREIGN PATENT DOCUMENTS

| | | |
|---|---|---|
| CN | 1863635 | 11/2006 |
| CN | 101160646 | 4/2008 |
| CN | 101162690 A | 4/2008 |
| JP | 2002-301583 | 10/2002 |
| JP | 2004-039660 | 2/2004 |
| JP | 2008-098595 | 4/2008 |
| JP | 2011-011972 | 1/2011 |
| JP | 2011-124476 | 6/2011 |
| JP | 5073260 | 11/2012 |
| KR | 10-1991-0007153 | 9/1991 |
| KR | 10-2003-0095313 | 12/2003 |
| KR | 10-2009-0017084 | 2/2009 |
| WO | WO 2007149208 | 12/2007 |

OTHER PUBLICATIONS

"The Digital Display Revolution: Built on Excimer Laser Annealing," available at http://www.coherent.com/downloads/e-newsletter-Whitepaper-FPD-rev2.pdf prior to Jan. 18, 2013 (4 pages).
Notice of Preliminary Rejection from Korean Patent Application No. 10-2014-0030097, dated Jan. 12, 2016, 14 pages (with English translation).
Official Letter from Taiwan Patent Application No. 103105390, dated Dec. 15, 2015, 17 pages (with English translation).
First Office Action from Chinese Patent Application No. 201410097021.X, dated Jul. 3, 2015, 24 pages (with English translation).
Notice of Preliminary Rejection from Korean Patent Application No. 10-2014-0029473, dated Jul. 27, 2015, 12 pages (with English translation).
Official Letter from Taiwan Patent Application No. 103105391, dated Jun. 23, 2015, 13 pages (with English translation).
Official Action from Taiwan Patent Application No. 103105391, dated Feb. 23, 2016, 11 pages (with English translation).
First Office Action from Chinese Patent Application No. 201410095844.9, dated Apr. 5, 2016, 18 pages (with English translation).
Second Office Action from Chinese Patent Application No. 201410097021.X, dated Apr. 22, 2016, 21 pages (with English translation).
Notice of Preliminary Rejection from Korean Patent Application No. 10-2014-0029473, dated May 27, 2016, 14 pages (with English translation).

* cited by examiner

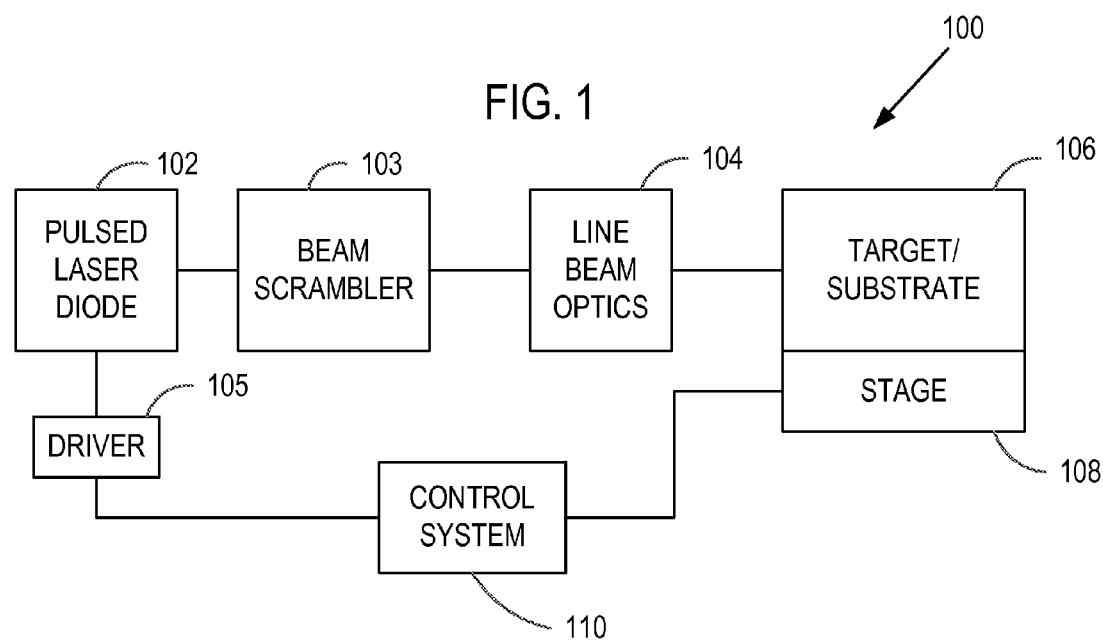
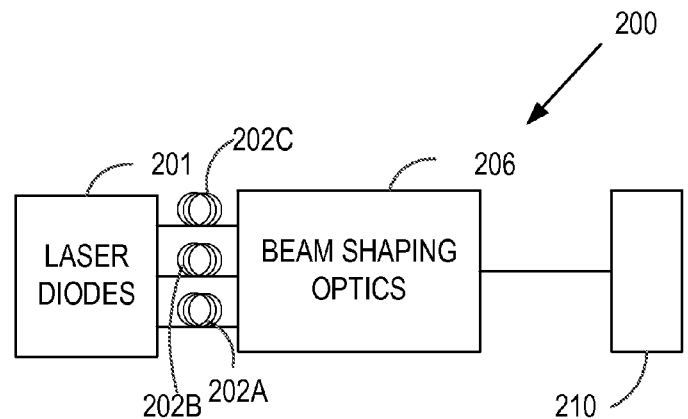

PULSED LINE BEAM DEVICE PROCESSING SYSTEMS USING LASER DIODES

FIELD

The disclosure pertains to laser diode based materials processing systems.

BACKGROUND

Silicon substrates of various types are used in numerous applications including solar cells and display devices. So-called amorphous silicon (a-Si) is used in high resolution liquid crystal displays to provide an active layer in which thin film transistors can be defined. Amorphous silicon can be deposited in thin films using PECVD. Low temperature polysilicon (LTPS) can be produced by exposing an a-Si layer to high intensity ultraviolet laser pulses that rapidly melt the deposited a-Si layer without heating the underlying substrate. The a-Si layer then crystallizes in grains having sizes that are dependent upon temperature gradients during processing. Typical mobility of an LTPS layer is on the order of about 50-150 $cm^2$/V-sec, superior to the 0.5 $cm^2$/V-sec mobility associated with a-Si.

Conventional LIPS processing is based on surface treatment with an excimer laser, or so-called excimer layer annealing (ELA). In ELA, a line-shaped, approximately uniform laser beam (typically at 308 nm) is directed as a series of pulses of durations of about 25 ns to an a-Si layer that is heated and melted. The molten layer then recrystallizes to form a layer of polycrystalline silicon (p-Si). Laser pulse energy and beam uniformity must be precisely controlled. Each area of the target a-Si layer is exposed to several excimer laser pulses, and the heating, melting, and recrystallization process is repeated. The resulting LTPS layer exhibits a rectangular array of crystalline regions. Processing is generally targeted to produce crystalline regions or "grains" that have dimensions of about 300 nm for most thin film transistor (TFT) backplanes.

Excimer lasers are complex and expensive to maintain as production equipment. Even the best excimer lasers tend to have very limited service lifetimes, and replacement of excimer laser cavities and associated optical components thereof can be disruptive and expensive. Although satisfactory results can be obtained, total processing costs associated with ELA remain high. Other laser-based processes also require complex or expensive equipment, and alternative approaches are needed.

SUMMARY

Methods and apparatus that use pulsed laser diodes for materials processing are disclosed. In one example, methods comprise selecting a substrate, and processing the substrate by exposing the substrate in an exposure area to a pulsed optical beam from at least one laser diode. In particular examples, the pulsed optical beam is shaped to form a line beam, wherein the exposure area corresponds to the line beam. According to some examples, the optical pulses of the pulsed optical beam have a pulse duration T and a pulse repetition frequency f such that fT is less than 1, 0.5, or 0.1. In typical examples, a wavelength range of the pulsed optical beam is between 700 nm and 980 nm, and a peak pulse power is at least 10/fT, 100/fT, or 1000/fT watts. In some examples, the pulsed optical beam is produced by a plurality of laser diodes, wherein wavelengths associated with the laser diodes are between 700 nm and 980 nm, and in some examples, at least two of the plurality of laser diodes have emission wavelengths that differ by at least 100 nm. In other examples, at least one the plurality of laser diodes is configured to emit a continuous optical beam. In still further examples, the pulsed optical beam is directed to the substrate as a line beam. According to some examples, at least one of the pulsed optical beam and the substrate are scanned to process the substrate. In some examples, scanning is configured so that the substrate area receives at least 2, 5, 10, 20 or 100 sequential optical pulses. In a particular example, the substrate is a glass with an amorphous silicon layer on a surface, and the pulsed optical beam is applied so as to produce a polysilicon layer on the surface. In some cases, the amorphous silicon layer is processed so that a mobility of the polysilicon is at least 1, 10, 50, 75, 100, or 150 $cm^2$/Vs. In additional alternatives, the pulsed optical beam is directed to a light guide configured to homogenize the pulsed optical beam, and the substrate is exposed to the homogenized optical beam.

Apparatus comprise a pulsed beam source that includes a plurality of laser diodes configured to produce respective pulsed optical beams. A beam shaping system is configured to shape the plurality of pulsed optical beams and expose a substrate to the pulsed optical beams, wherein a duty cycle of the pulsed optical beams is less than about 0.5, 0.2, 0.1, 0.05, or 0.01. In other examples, the beam shaping optical system includes a beam homogenizer configured to produce a homogenized beam, and a lens configured to direct the homogenized beam to the substrate as a line beam. In some examples, a plurality of optical fibers is situated to deliver respective beams of the plurality of beams to the beam homogenizer.

The foregoing and other objects, features, and advantages of the disclosed technology will become more apparent from the following detailed description, which proceeds with reference to the accompanying figures.

BRIEF DESCRIPTION OF THE DRAWINGS

FIG. 1 illustrates a representative processing system that includes a laser diode pulsed beam source.

FIG. 2 illustrates a representative processing system that includes fiber-coupled laser diodes configured to provide a pulsed optical beam.

DETAILED DESCRIPTION

Figure 3:
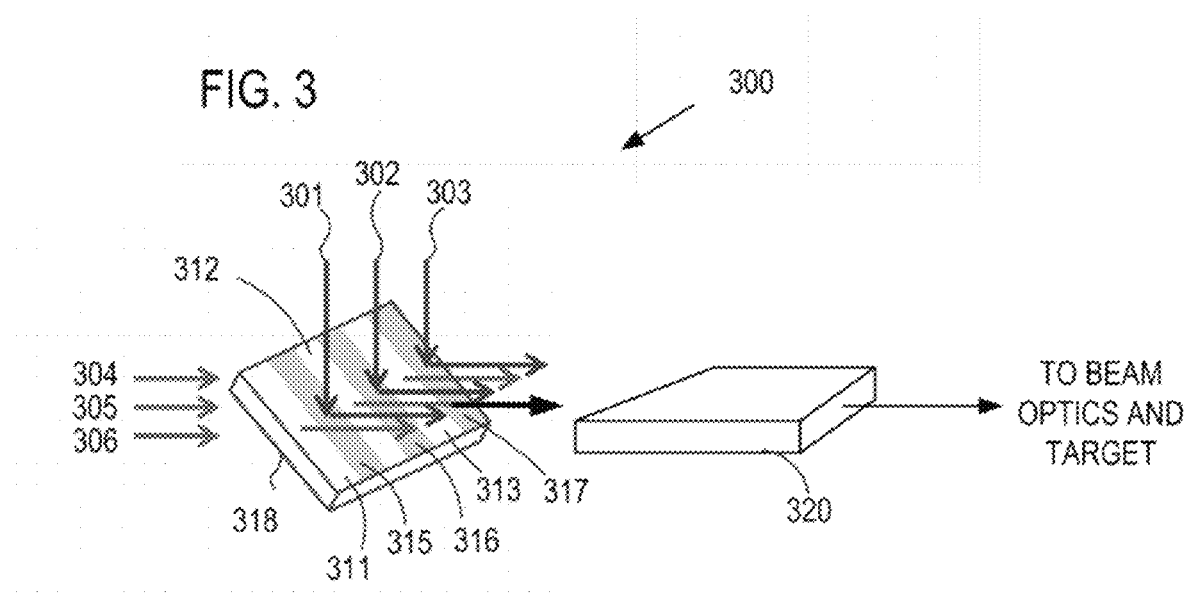
FIG. 3 illustrates a representative apparatus for combining fiber-coupled or free space optical beams into a light pipe.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

The disclosed methods and apparatus are described with respect to representative applications such as annealing silicon to form LTPS, ablation, or laser spike annealing, plastic welding, soldering, or other bonding or annealing processes. In some examples, optical beams are delivered to substrates in line beams formed using free space optics, fiber optics, or a combination thereof. Laser diodes used in the disclosed methods and apparatus typically produce optical beams at wavelengths between about 600 nm and 2100 nm. Single emitters can be used if capable of providing adequate optical power, but in most applications, arrays or stacks of laser diodes are used having beams that are combined with free space optics or in optical fibers. In any particular application, a suitable laser diode wavelength is selected based on the associated absorption coefficients of one or more substrate materials or layers on a substrate. Optical power can be applied as a focused spot or as a line beam or other shape. In many applications, line beams are convenient.

Referring to FIG. 1, a laser diode-based processing system 100 includes one or more laser diodes 102 coupled to a driver 105 that applies pulse currents having magnitudes and durations selected to produce optical pulses of suitable pulse energy, pulse power, pulse duration, at a selected pulse repetition rate. The optical pulses are shaped into a pulsed line beam with line beam optical system 104 and directed to a target 106 such as a substrate. If desired, a beam scrambler or homogenizer 103 can receive the pulses and provide a more uniform power distribution in the line beam. A stage 108 retains the target 106 and scans the target 106 with respect to the line beam to process the target 106. A control system 110 is coupled to the pulsed laser diodes 102 and the stage 108 so as to control beam/target positioning, optical beam properties, and beam focus. For an available optical power, a line beam area as focused on the target is selected to produce a process specific intensity or fluence. Target scan rate is determined based on line beam area, typically line beam width, pulse repetition rate, and the extent of pulse overlaps to be obtained at the target. In some processes, line beams associated with sequential pulses have large, small, or no overlaps. In many applications such as LTPS processing, multiple exposures at a particular target location increase process quality. Effective fluences range from about 1 mJ/cm$^2$ to about 10,000 mJ/cm$^2$ 10 mJ/cm$^2$ to about 1000 mJ/cm$^2$, about 20 mJ/cm$^2$ to about 500 mJ/cm$^2$ or about 50 mJ/cm$^2$ to about 125 mJ/cm$^2$.

The beam scrambler can be implemented using segmented lenses or mirrors, lens arrays such as fly eye lens arrays, or tapered or untapered light guides having circular, rectangular, or other cross-sectional areas. One example of a beam scrambler is disclosed in Farmer et al., U.S. Patent Application Publication 2012/0168411A1, which is incorporated herein by reference.

FIG. 2 is a block diagram of an exposure system 200 in which a plurality of laser diodes are coupled to provide an optical beam via optical fibers 202A-202C. Beam shaping optics 206 receives beams from the optical fibers 202A-202C, and direct corresponding shaped beams to a target 210. The shaped beams can be arranged as separate line beams or focused spots, or some or all of the beams can be combined in a common line beam or focused spot. One or more laser diodes (such as laser diode stacks) can be coupled to each of the fibers 202A-202C, and the fibers 202A-202C can have different or the same core sizes, ranging from single mode cores to cores of diameters between 50 μm to 1 mm. The laser diodes associated with each of the fibers 202A-202C can have the same or different emission wavelengths, and a combination of wavelengths can be coupled into each of the fibers 202A-202C. For example, laser diodes having various emission wavelengths between about 800 nm and 980 nm can be used. The absorption coefficient of silicon varies by about a factor of 10 over this wavelength range, so that energy deposition as a function of depth can be tailored. Systems similar to that of FIG. 2 can be implemented without optical fibers. In some examples, sets of laser diodes are coupled to beam homogenizers, and a plurality of homogenized beams are shaped and delivered to a target.

FIG. 3 illustrates a multi-emitter system 300 that permits optical beams received along axes 301-303 to be reflected to a rectangular light guide 320 by an interleaver 318. Optical beams received along the axes 304-306 are transmitted by the interleaver 318 to the light guide 320, and along with the reflected beams, are directed after scrambling, to a target. The interleaver 318 includes a plurality of transmissive regions 311-313 and a plurality of reflective regions 315-317 configured to transmit or reflect input beams along selected axes. Laser diode output beams can be shaped with bulk optical elements and directed to the interleaver 318, or beams from optical fibers can be collimated and coupled to the interleaver 318. The beams can have different wavelengths, pulse durations, beam cross-sectional areas, shapes, numerical apertures, pulse durations, pulse repetition rates, polarizations, or be coupled from optical fibers having different core shapes, sizes, or numerical apertures. The light guide 320 is shown as having a rectangular cross-sectional area, but other shapes can be used and in some cases, tapered light guides are used.

Laser diode systems comprising multiple laser diodes can provide continuous optical powers of at least 500 W to 1 kW. Such laser diodes and diode assemblies are operable to produce pulses as well. Peak powers can be provided that are greater than the available continuous wave powers. At pulse durations and laser drive currents having durations of about 1 ms or longer, laser diode internal temperatures approach continuous wave conditions. Different laser diode structures may have somewhat different quasi-CW pulse durations $T_{CW}$. For shorter pulse durations, laser diode peak power $P_{pk}$ can be increased depending on pulse duration T and pulse repetition frequency (PRF). Then, peak power can be up to at least $P_{CW}/(PRF \cdot T)$, wherein PRF·T is associated with laser diode duty cycle. With pulsed operation and increased peak power, larger substrate areas can be exposed so that larger spot sizes or longer line beams can be used, while maintaining laser diode junctions at temperatures no greater than in continuous operation. For example, a laser diode rated for operation at 1 W optical power in continuous operation can be pulsed to have 50 W peak power when operated at 1 kHz with pulse duration of 20 μs.

In some examples multi-emitter systems can be used to process silicon substrates, or silicon layers such as amorphous silicon on glass or other substrates, including rigid and flexible substrates. Beam shapes and scan rates are adjustable to obtain suitable fluences. With exposures at most laser diode wavelengths, beam energy is transmitted by transparent substrates such as glass, and substrate damage or heating is not a concern. In addition, at some laser diode wavelengths, the absorption coefficient of silicon is small enough (about $10^3$/cm in comparison with $10^6$/cm at excimer wavelengths), that a portion of an incident beam is transmitted by thin silicon layers, and higher beam powers can be needed to deposit sufficient energy.

In some examples, laser pulse parameters are selected to reduce average power and retain peak power that may be required for processing. Reducing average power can reduce thermal stresses, so that substrates do not warp. Typical pulse widths range from about 1 ms (quasi-CW) to about 1 μs, so that PRFs can range from about 1 kHz to about 1 MHz, without exceeding CW limits. In other examples, pulse durations range from about 1 ns to about 500 μs.

While pulsed beams permit higher peak powers without additional thermal stress on laser diode junctions, pulsed and continuous beams can be combined and applied to a substrate. For example, a continuous beam can be used to preheat a substrate prior to application of a pulsed processing beam, or a pulsed processing beam can be applied followed by a post-heating beam to, for example, anneal a substrate to remove process beam induced stress. In some examples, different wavelengths are selected so that a first beam (pulsed or continuous) interacts with one or more layers on the substrate, and a second beam (pulsed or continuous) is selected to interact with one or more different layers or the substrate itself.

In some examples, the disclosed methods and apparatus are used to anneal doped layers in, or on, a substrate. The doped layer can be a doped polycrystalline silicon layer with dopant concentration from about $1\times10^{18}$/cm$^3$ to about $1\times10^{21}$/cm$^3$ that is thermally annealed with a rapid thermal annealing (RTP) process. The layer is then annealed at a temperature of about 1000° C. to about 1400° C. with a pulsed beam such as a pulsed line beam for between about 10 ms and 10 s. In other examples, the disclosed methods and apparatus are used to activate dopants or to diffuse dopants is a semiconductor layer or a semiconductor substrate. In some examples, substrate temperature is controlled so as to be less than about 1100° C. or other temperature to reduce dopant diffusion. Choice of a particular temperature is generally material dependent, and for some processes, melting is avoided.

Having described and illustrated the principles of the disclosed technology with reference to the illustrated embodiments, it will be recognized that the illustrated embodiments can be modified in arrangement and detail without departing from such principles. The particular arrangements above are provided for convenient illustration, and other arrangements can be used. We therefore claim as our invention all that comes within the scope and spirit of the appended claims.

We claim:

1. A method, comprising:
   selecting a substrate having an amorphous silicon layer;
   shaping a pulsed optical beam to form an optical line beam by combining constituent pulsed optical beams from a plurality of laser diodes, wherein wavelengths associated with the laser diodes are between 780 nm and 980 nm and at least two of the plurality of laser diodes have emission wavelengths that differ by at least 25 nm; and
   processing the amorphous silicon layer of the substrate by exposing the amorphous silicon layer to the optical line beam so as to produce a polysilicon layer, wherein an exposure area corresponds to the optical line beam cross-sectional area.

2. The method of claim 1, wherein the pulsed optical beam has a pulse duration T that is between 1 ms and 1 μs and a pulse repetition frequency f that is between 1 kHz and 1 MHz.

3. The method of claim 1, wherein fT is less than 0.5.

4. The method of claim 1, wherein fT is less than 0.1.

5. The method of claim 1, wherein a peak pulse power is at least 10/fT Watts.

6. The method of claim 5, wherein the peak pulse power is at least 100/fT Watts.

7. The method of claim 6, wherein the peak pulse power is at least 1000/fT Watts.

8. The method of claim 1, wherein at least one the plurality of laser diodes is configured to emit a continuous optical beam.

9. The method of claim 1, further comprising scanning at least one of the optical line beam and the substrate so as to process the substrate.

10. The method of claim 1, wherein the scanning is configured so that the substrate area receives at least ten sequential optical pulses.

11. The method of claim 1, wherein the amorphous silicon layer is processed to have a mobility of at least 10 cm$^2$/Vs.

12. The method of claim 1, wherein the amorphous silicon layer is processed to have a mobility of at least 50 cm$^2$/Vs.

13. The method of claim 1, further comprising directing the pulsed optical beam to a light guide configured to homogenize the pulsed optical beam, wherein the homogenized pulsed optical beam is shaped to form the optical line beam.

14. The method of claim 1, wherein the substrate includes a region that includes a dopant, wherein the optical line beam is applied so as to diffuse the dopant from the doped region.

15. The method of claim 14, wherein the substrates includes a layer having doped region and the optical line beam is applied so as to diffuse the dopant in the layer.

16. The method of claim 15, wherein the layer is a doped silicon layer.

17. The method of claim 1, wherein the substrate is exposed to the optical line beam in the exposure area so as to maintain a temperature of at least 500° C. for between at least 100 ms and 2 s.

18. The method of claim 1, wherein the substrate is exposed to the optical line beam in the exposure area so as to maintain a temperature of at least 1000° C. for between at least 100 ms and 2 s.

19. The method of claim 1, wherein the substrate includes a region that includes a dopant, wherein the optical line beam is applied so as to activate the dopant in the doped region.

20. The method of claim 19, wherein the substrates includes a layer having doped region and the optical line beam is applied so as to activate the dopant in the layer.

21. The method of claim 20, wherein the layer is a doped silicon layer.

22. The method of claim 1, further comprising a beam shaping optical system that combines and shapes the constituent pulsed optical beams to form the pulsed optical beam, wherein a duty cycle of the constituent pulsed optical beams is less than about 0.5.

23. The method of claim 22, wherein the beam shaping optical system includes a beam homogenizer that receives the constituent pulsed optical beams and produces the pulsed optical beam as a homogenized beam.

24. The method of claim 23, wherein each of the constituent pulsed optical beams is coupled to a corresponding optical fiber that directs the constituent pulsed optical beam to the beam homogenizer.

* * * * *